United States Patent
Northrup et al.

(10) Patent No.: US 9,252,329 B2
(45) Date of Patent: Feb. 2, 2016

(54) ULTRAVIOLET LIGHT EMITTING DEVICES HAVING COMPRESSIVELY STRAINED LIGHT EMITTING LAYER FOR ENHANCED LIGHT EXTRACTION

(75) Inventors: John E. Northrup, Palo Alto, CA (US); Christopher Chua, San Jose, CA (US); Michael Kneissl, Berlin (DE); Thomas Wunderer, Palo Alto, CA (US); Noble M. Johnson, Menlo Park, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 181 days.

(21) Appl. No.: 13/328,783

(22) Filed: Dec. 16, 2011

(65) Prior Publication Data

US 2013/0082237 A1   Apr. 4, 2013

Related U.S. Application Data

(63) Continuation-in-part of application No. 13/252,691, filed on Oct. 4, 2011, now abandoned.

(51) Int. Cl.
*H01L 33/32* (2010.01)

(52) U.S. Cl.
CPC .................................. *H01L 33/32* (2013.01)

(58) Field of Classification Search
None
See application file for complete search history.

(56) References Cited

U.S. PATENT DOCUMENTS

| | | | |
|---|---|---|---|
| 2002/0096675 A1* | 7/2002 | Cho et al. | 257/25 |
| 2007/0101932 A1 | 5/2007 | Schowalter et al. | |
| 2009/0283028 A1* | 11/2009 | Schowalter et al. | 117/9 |
| 2010/0108985 A1 | 5/2010 | Chung et al. | |
| 2010/0219395 A1* | 9/2010 | Hirayama et al. | 257/13 |
| 2011/0103421 A1* | 5/2011 | Sharma et al. | 372/45.012 |
| 2012/0018753 A1* | 1/2012 | Hao et al. | 257/94 |

FOREIGN PATENT DOCUMENTS

| | | | | |
|---|---|---|---|---|
| EP | 2037506 | | 3/2009 | |
| WO | WO2010111854 A1 * | | 10/2010 | H01L 33/40 |
| WO | WO2011104969 A1 * | | 9/2011 | H01L 33/32 |

OTHER PUBLICATIONS

Cassidy et al., "Polarization of the Output of InGaAsP Semiconductor Diode Lasers", IEEE Journal of Quantum Electronics, vol. 25, No. 6, Jun. 1989, pp. 1156-1160.

Dang et al., "Optical Polarization Anisotropy of Tensile Strained InGaN/AlInN Quantum Wells for TM Mode Lasers", Journal of Applied Physics, vol. 108, 2010, 4 pages.

Jia et al., "Polarization of Edge Emission from III-Nitride Light Emitting Diodes of Emission Wavelength from 395 to 455nm", Applied Physics Letters, 90, 2007, 3 pages.

(Continued)

*Primary Examiner* — Michael Jung
(74) *Attorney, Agent, or Firm* — Hollingsworth Davis, LLC

(57) ABSTRACT

Light emitting devices having an enhanced degree of polarization, $P_D$, and methods for fabricating such devices are described. A light emitting device may include a light emitting region that is configured to emit light having a central wavelength, $\lambda$, and a degree of polarization, $P_D$, where $P_D > 0.006\lambda - b$ for 200 nm $\leq \lambda \leq$ 400 nm, wherein $b \leq 1.5$.

23 Claims, 19 Drawing Sheets

(56) References Cited

OTHER PUBLICATIONS

2010 Kolbe et al., "Optical Polarization Characteristics of Ultraviolet (In)(Al)GaN Multiple Quantum Well Light Emitting Diodes", Applied Physics Letters, 97, 2010, 3 pages.

Shakya et al., "Polarization of III-Nitride Blue and Ultraviolet Light-Emitting Diodes", Applied Physics Letters, 86, 2005, 3 pages.

Tanbun-Ek et al., "Measurements of the Polarization Dependent of the Gain of Strained Multiple Quantum Well InGaAs-InP Lasers", IEEE Photonics Technology Letters, vol. 3, No. 2, Feb. 1991, pp. 103-105.

Nishida et al., "AlGaN-based ultraviolet light-emitting diodes grown on bulk AlN substrates," Applied Physics Letters, vol. 84, No. 6, Feb. 9, 2004, pp. 1002-1003.

2011 Sharma et al., "Strain-driven light-polarization switching in deep ultraviolet nitride emitters," Physical Review, vol. 84, No. 035305, 2011, pp. 1-8.

2010 Taniyasu et al., "Surface 210 nm light emission from an AlN p-n junction light-emitting diode enhanced by A-plane growth orientation," Applied Physics Letters, vol. 96, No. 221110, 2010, pp. 1-3.

International Search Report dated Apr. 24, 2014 from European Application No. 12187070.3, 12 pages.

\* cited by examiner

ULTRAVIOLET LIGHT EMITTING DEVICES HAVING COMPRESSIVELY STRAINED LIGHT EMITTING LAYER FOR ENHANCED LIGHT EXTRACTION

RELATED PATENT DOCUMENTS

This application claims priority as a Continuation-in-Part Application under 35 U.S.C. §120 to pending U.S. patent application Ser. No. 13/252,691, filed Oct. 4, 2011, which is incorporated herein by reference.

STATEMENT REGARDING FEDERALLY SPONSORED RESEARCH AND DEVELOPMENT

This invention was made with Government support under U.S. Army Cooperative Agreement No. W911NF-10-02-0102 awarded by the Defense Advanced Research Projects Agency (DARPA). The Government has certain rights in this invention.

SUMMARY

Light emitting devices having an enhanced degree of polarization, $P_D$, and methods for fabricating such devices are described. In some embodiments, a nitride-semiconductor light emitting device comprising a light emitting region is configured to emit light having a central wavelength, $\lambda$, and a degree of polarization, $P_D$, where $P_D > 0.006\lambda - b$ for 200 nm $\leq \lambda \leq$ 400 nm, wherein b $\leq$ 1.5. In some cases, b is equal to about 1. For example the light emitting region may comprise at least one of GaN, InAlN, AlGaN, InGaN and InAlGaN.

Some embodiments involve a light emitting device having a light emitting region grown above a bulk crystalline AlN substrate, wherein variation in reciprocal lattice values of the AlN substrate and the light emitting region is less than about 1.5%.

Some embodiments involve a light emitting device comprising a light emitting region configured to emit light having a central wavelength, $\lambda$, and a degree of polarization, $P_D$, where $P_D > 0$ for 200 nm $\leq \lambda <$ 300 nm.

Some embodiments involve methods for making light emitting devices. For example, a method may include growing a first heterostructure and a second heterostructure. A III-nitride light emitting region is grown on the first heterostructure so that the light emitting region is disposed between the first and second heterostructures. The light emitting region comprises at least one compressively stained layer, wherein a compressive strain, $\epsilon_\alpha$, in the compressively strained layer satisfies the inequality $\epsilon_\alpha < -0.00615 + 0.00023*(\lambda \text{ (nm)} - 230 \text{ nm})$.

DESCRIPTION OF VARIOUS EMBODIMENTS

Figure 1:
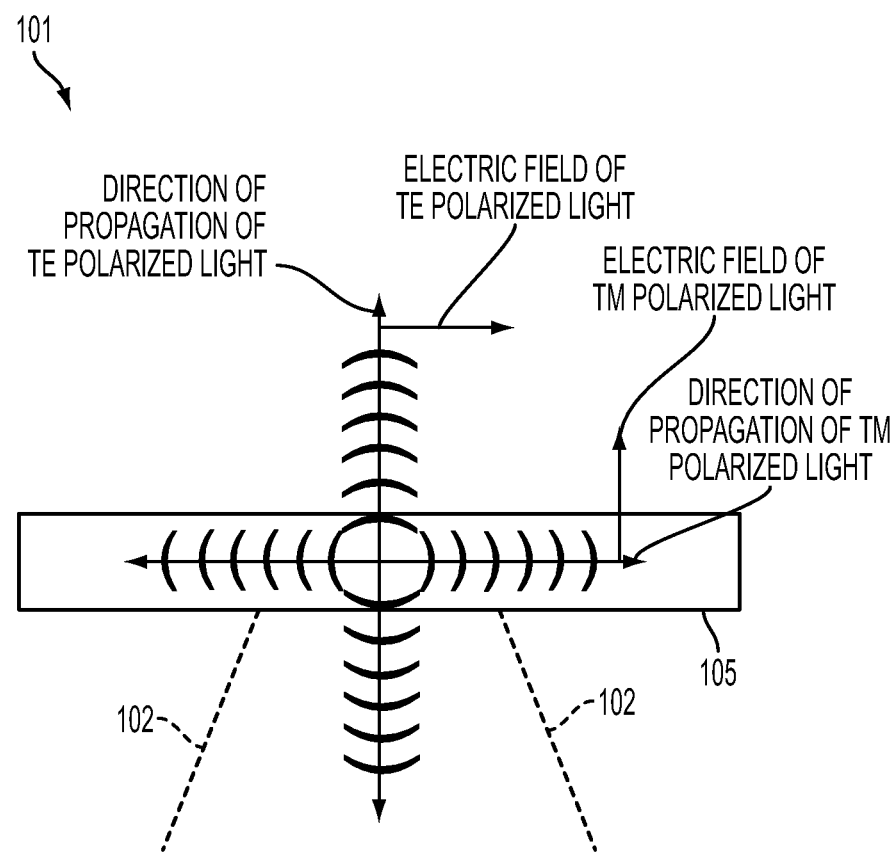
FIG. 1 is a diagram that illustrates TE and TM polarized light.

Light generated by a semiconductor light emitting region may have polarization characteristics that affect the direction of propagation from the light emitting device. As illustrated in FIG. 1, light that propagates along an axis perpendicular to the emitting surface 105 of the light emitting device 101, or at an angle with respect to the axis perpendicular to the emitting surface 105 that is within an escape cone 102 of emitted light, emerges from the emitting surface 105 of the device 101. Light that propagates parallel to the emitting surface 105 of the device 101, or at an angle outside of the escape cone 102 may be substantially lost to absorption within the device 101 without contributing to the total light output of the device 101.

As further illustrated in FIG. 1, a light emitting device 101 can generate TM polarized light (having an electric field generally perpendicular to wafer plane) and TE polarized light (having an electric field generally parallel to the wafer plane of the device). TM polarized light propagates in a direction generally parallel to the wafer plane, i.e. generally, parallel to the emitting surface 105 of the light emitting device 101. TE polarized light propagates in a direction generally perpendicular to the wafer plane, i.e., generally perpendicular to the emitting surface 105 of the light emitting device 101. Thus, in the example of FIG. 1, the TE polarized light can emerge easily from the device, whereas the TM polarized light is predominantly trapped and absorbed within the device layers.

Ultraviolet light emitting devices, such as ultraviolet light emitting diodes (UV LEDs) have been fabricated using III-nitride material systems, such as AlGaN, InAlN and/or InAlGaN. For devices that use III-nitride materials, the wavelength of the emitted light decreases and the amount of TM polarized light generated increases with increasing Al content (Al molar fraction). Thus, for UV LEDs, as the Al content in the light emitting region increases, the fraction of TM polarized light emitted by the light emitting region also increases, which can come at the expense of emitted TE polarized light. Consequently, the light output efficiency of UV LEDs may be limited by light extraction efficiency as the wavelength of the devices decreases.

For some device configurations, TE polarized light is propagated generally along the axis perpendicular to the output surface of the device and TM polarized light is propagated generally along an axis parallel to the output surface of the device. Thus, the relative amount of light generated by a light emitting region of a device having the preferred (TE) polarization, $P_D$, referred to herein as the degree of polarization, can be characterized by the equation:

$$P_D = \frac{I_{TE} - I_{TM}}{I_{TE} + I_{TM}}, \quad [1]$$

where $I_{TE}$ and $I_{TM}$ are the integrated in-plane-emitted TE and TM polarized electroluminescence light intensities, respectively. As discussed above, it is desirable to enhance the amount of TE light generated by the device to increase the overall light extraction efficiency of the device.

III-nitride materials are anisotropic along and perpendicular to the direction of the crystallographic axis. This anisotropy results in the splitting of the valence bands. For example, the splitting of the valance bands in III-nitride alloys produces a degree of polarization of the emitted light that changes with the Al composition of the alloy. For relatively high Al concentrations used in short wavelength (<about 300 nm) devices, the TM-polarized light can dominate. However, the valence band energies are also affected by the lattice strain, which influences the degree of polarization. Compressive strain is associated with increased generation of TE polarized light, whereas tensile strain is associated with increased generation of TM polarized light. Thus, growing devices having III-nitride light emitting regions that are compressively strained increases the relative amount of TE-polarized light.

Various examples provided herein are based on epitaxially grown layers with (0001) c-plane crystallographic orientation, and involve enhancing the degree of polarization, $P_D$, to achieve an increase in light propagated along the direction perpendicular to the device output surface. However, the general concepts involving enhancing the emitted TE polarized light as discussed herein can be applied to devices having layers grown having other crystallographic orientations.

Light emitting device structures that produce an enhanced degree of polarization, $P_D$, are discussed along with methods to produce these device structures. In some embodiments, the light emitting region of the device is grown under compressive strain. The compressive strain alters the semiconductor band structure of the light emitting layers, resulting in devices that exhibit an enhanced degree of polarization. Alternatively or additionally, the Al content of barrier layers of in light emitting region may be selected to increase the generation of TE polarized light.

In addition to the configuration of the light emitting region discussed herein, some light emitting devices include heterostructures disposed on one or both sides of a light emitting region. These heterostructures contribute to device performance by facilitating the growth of high quality crystalline layers, including the barrier layers and QWs, by reducing defects, cracking, and surface roughness, for example. One or more of the heterostructures may include transition layers that serve to gradually transition the device layers from the lattice structure of the substrate to that of the light emitting region. These transition layers influence the crystal quality and overall reliability of the light emitting device. In various embodiments, the light emitting regions discussed herein can be used alone or in combination with heterostructures and/or transition layers as discussed in more detail below. In various embodiments, the heterostructures and light emitting region can be grown on substrates comprising sapphire, GaN, AlN, AlGaN, InAlGaN, Si, SiC and/or other substrate materials.

Figure 2:
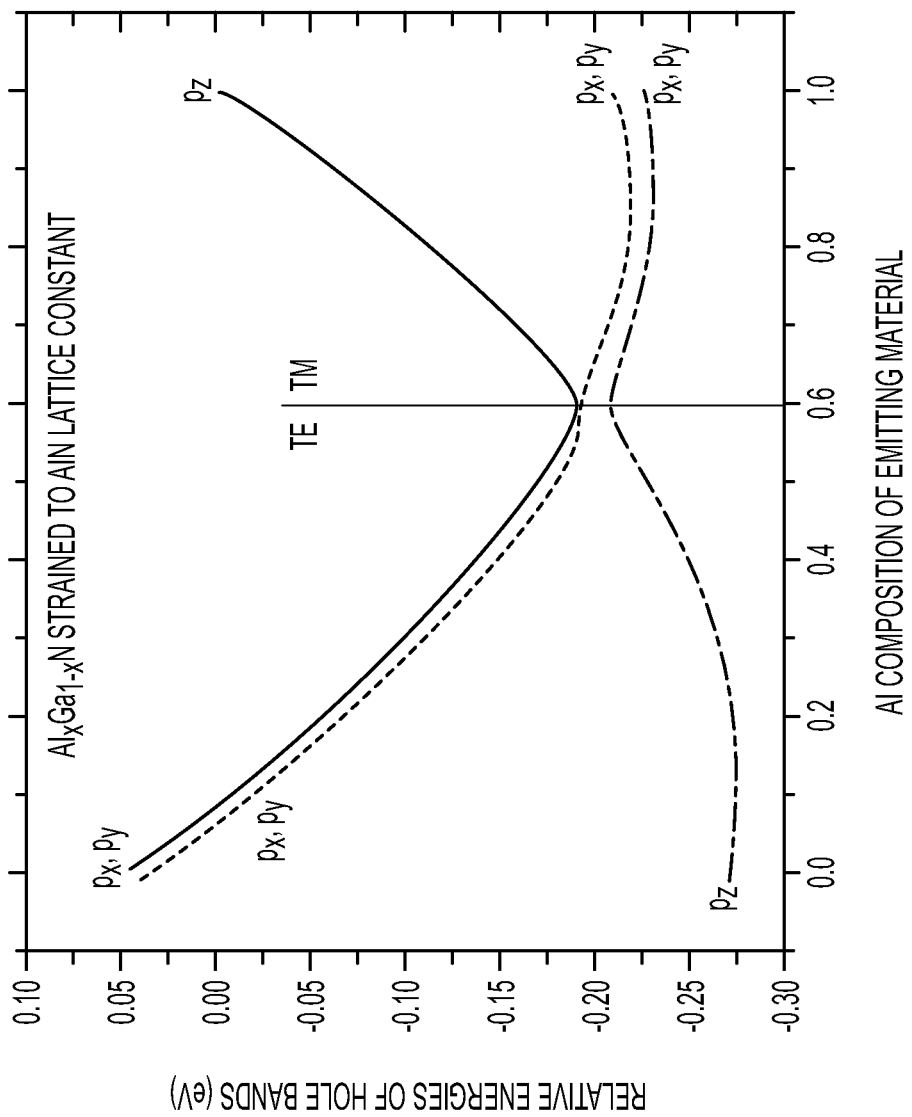
FIGS. 2 and 3 show the relative energies of valence bands in $Al_xGa_{1-x}N$ calculated as a function of quantum well aluminum molar fraction.
Figure 3:
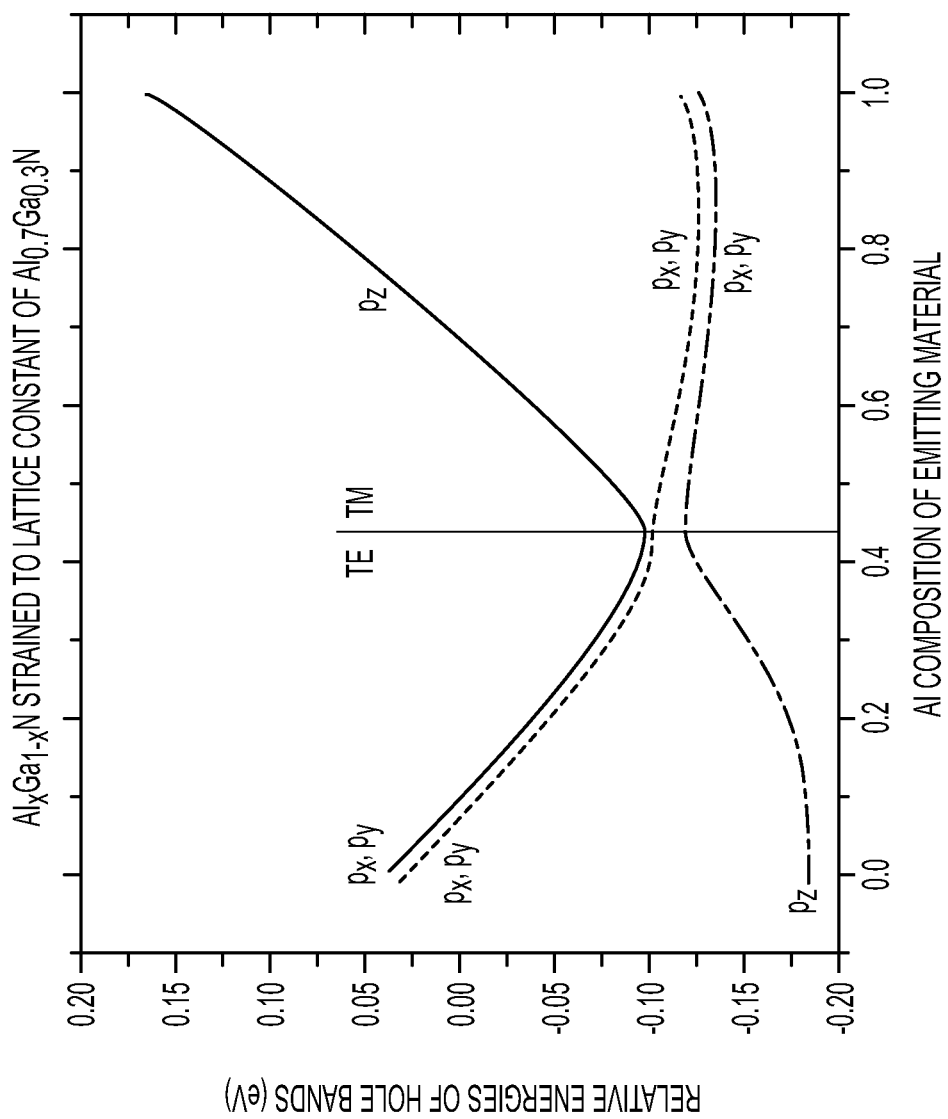

FIGS. 2 and 3 show the relative energies of valence bands in $Al_xGa_{1-x}N$ calculated as a function of quantum well aluminum molar fraction. The valence band energies depend on the strain in the emitting $Al_xGa_{1-x}N$ material. The strain can be controlled by pseudomorphic growth of the light emitting region on various substrates. FIG. 2 shows the valence bands in $Al_xGa_{1-x}N$ material grown on a bulk crystalline AlN substrate and strained to the lattice constant of the AlN. FIG. 2 shows the bands in $Al_xGa_{1-x}N$ material grown on $Al_{0.7}Ga_{0.3}N$ and strained to the lattice constant of the $Al_{0.7}Ga_{0.3}N$. Theoretically, TM-polarization occurs when the highest valence band has "$p_z$" character, and TE polarization occurs when the highest valence band has "$p_x, p_y$" character. In FIG. 2, this particular calculation indicates a crossover composition at about 60% Al. The TM polarized emission becomes dominant for Al compositions greater than about 60%. In FIG. 3, the calculation indicates a cross-over composition at about 43% Al. The TM polarized emission becomes dominant for Al compositions greater than about 43%. The general trend is that the crossover composition shifts to higher Al compositions as the compressive strain in the emitting material is increased. The calculations shown in FIGS. 2 and 3 do not take into account the fact that the holes are confined within quantum wells of finite width and that there are electric fields in these quantum wells which arise from spontaneous and piezoelectric polarization. Thus these figures are intended to describe a general trend but not necessarily to provide the actual cross-over wavelength, which, for various device structures, may differ from those indicated in the figures. Regardless of the specific crossover point, FIGS. 2 and 3 illustrate that pseudomorphic growth of AlGaN on AlN produces more compressive strain in the light emitting lattice which allows more TE polarization to be achieved at relatively shorter wavelengths than can be achieved in growth on $Al_{0.7}Ga_{0.3}N$, which produces a light emitting region that is relatively less compressively strained.

To determine the actual cross-over wavelength, we have performed calculations of the energies of the hole states in $Al_xGa_{1-x}N$ quantum wells surrounded by barrier regions of $Al_yGa_{1-y}N$. These calculations take into account the well width and the electric fields in the wells. Both the quantum well and the barrier region have the same in-plane lattice constant, $a_{strained}$, which may be equal to or larger than the in-plane lattice constant of bulk AlN, $a_{bulk-AlN}$. The Al composition y of the barrier material is greater than x so that the holes are confined within the quantum wells. The calculations that we have performed show that increasing y promotes TE polarization. The relative energies of the hole states depend on y and x. As the barrier composition y increases the value of x for which the polarization crosses over from TE to TM is increased. Thus, in addition to the compressive strain in the light emitting region, the Al composition of the barrier is a factor affecting the polarization of the light.

Figure 4:
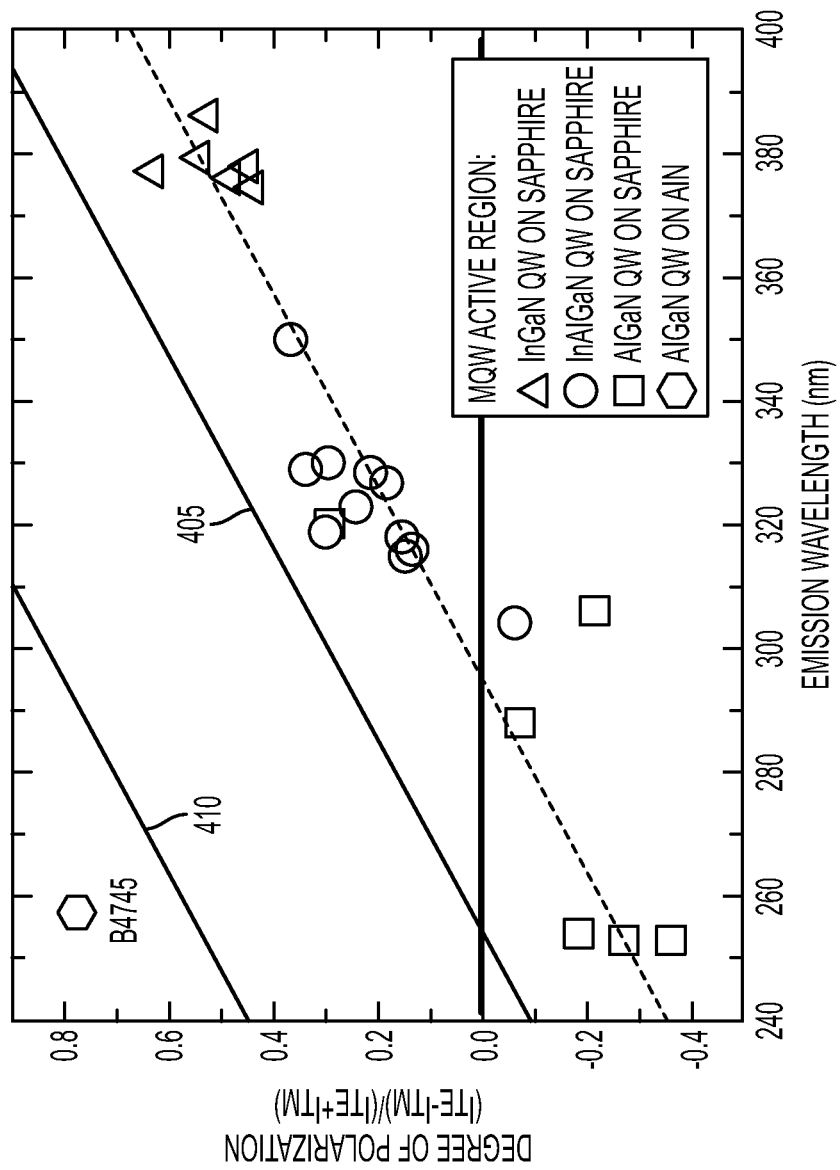
FIG. 4 shows the degree of polarization of various devices having light emitting regions comprising III-nitride alloys, including a device that has a compressively strained light emitting region according to embodiments discussed herein.

FIG. 4 shows the measured the degree of polarization, $P_D$, as set forth in Equation 1 above, obtained from light emitting diodes (LEDs) having central wavelengths ranging from $\lambda$=250 nm to $\lambda$=390 nm. The central wavelength, $\lambda$, is the wavelength emitted from the device that has the greatest intensity. Sometimes the central wavelength of the device is more simply referred to herein as the emission wavelength or the wavelength of the device. The degree of polarization was determined by measuring the light emitted in the wafer plane. The in-plane emitted light was collected with a lens and analyzed after an iris diaphragm by a Glan-Taylor prism and optical fiber spectrometer. The light was focused with a second lens on the optical fiber spectrometer. The experimental setup for measuring the polarization of the light is discussed more fully in T. Kolbe, A. Knauer, C. Chua, Z. Yang, S Einfeldt, P Vogt, N. M. Johnson, M. Weyers and M. Kneissl, Appl. Phys. Lett. 97, 171105 (2010), which is incorporated herein by reference.

The degree of polarization of various III-nitride light emitting region alloys spanning InGaN, InAlGaN, and AlGaN emitting in the wavelength range $\lambda$=250 nm to $\lambda$=400 nm are shown in FIG. 4. The integrated in-plane-emitted TE and TM polarized electroluminescence light intensities are denoted by $I_{TE}$ and $I_{TM}$, respectively. As expected, the TM polarized component becomes increasingly dominant at shorter wavelengths. The dashed line is a guide for the eye, and the solid line denotes the zero degree of polarization point, where equal intensities of TE and TM polarized light are emitted. The measured data plotted along the dashed line suggest a cross-over wavelength at around $\lambda$=295 nm, below which the polarization becomes predominantly TM.

Some devices described herein that achieve enhanced degree of polarization, $P_D$, include light emitting regions that are compressively strained and/or include selected Al content in the barrier regions. The compressive strain of the crystalline lattice in the emitting region and/or Al content of the barriers serves to counteract the shift in polarization toward TM polarized light that accompanies increased Al content in UV emitting devices. Light emitting diodes fabricated according to the techniques discussed in this disclosure are represented by data labeled B4745 in FIG. 4.

Embodiments of the invention are directed to devices having light emitting regions that generate light having an enhanced degree of polarization, $P_D$. As will be appreciated from FIG. 4, the enhanced $P_D$ may be greater than 0 or in a range between about 0 to about 0.8 when 200 nm≤$\lambda$<300 nm. For devices emitting light having wavelengths in the range 300 nm≤$\lambda$<350 nm, an enhanced $P_D$ may have a value greater than about 0.5 or in the range of about 0.5 to about 0.8. For devices emitting light in the wavelength range 350 nm≤$\lambda$<400 nm, enhanced $P_D$ may be greater than about 0.7 or in a range from about 0.7 to about 0.8.

The enhanced degree of polarization, $P_D$, may include values in the region above and to the left of line 410 in FIG. 4 or even values in the region above and to the left of line 405. For example, the enhanced degree of polarization may be expressed as:

$$P_D > 0.006\lambda - b \text{ for } 200 \text{ nm} \leq \lambda \leq 400 \text{ nm}. \quad [1]$$

where b may be less or equal to than about 1.5 (corresponding to line 405) or less than or equal to about 1 (corresponding to line 410).

Figure 5:
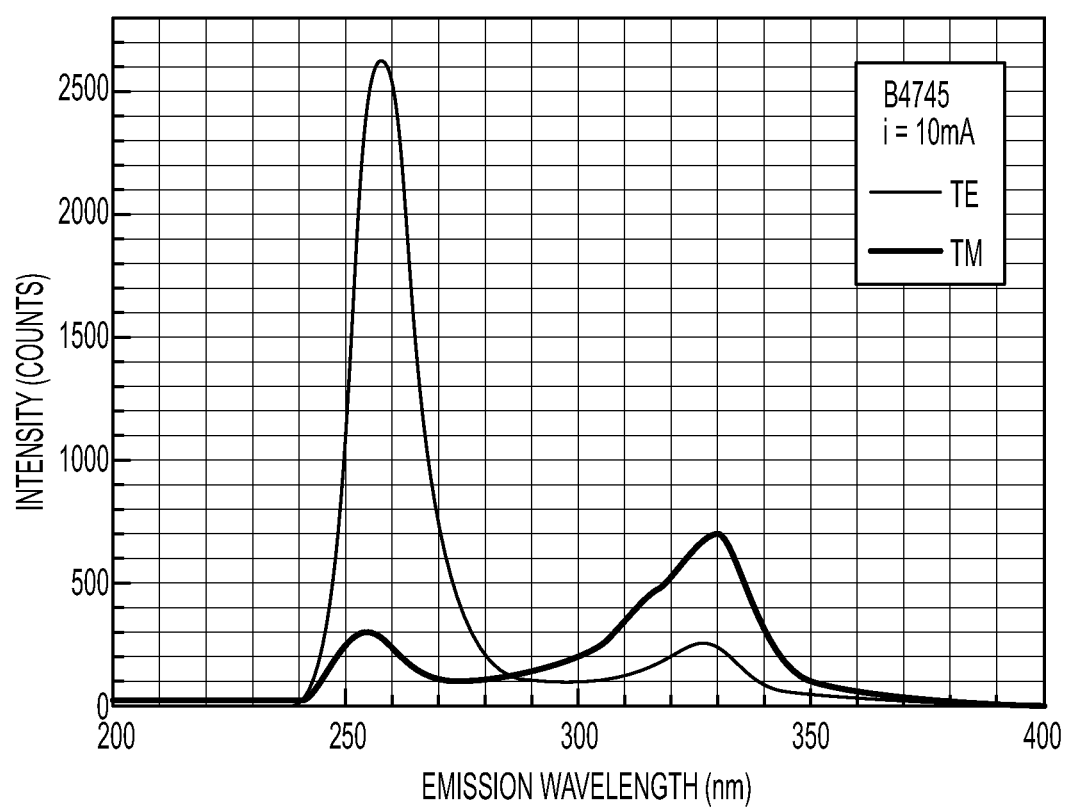
FIG. 5 shows the photoluminescence plot for a device having a compressively strained light emitting region according to embodiments discussed herein.

FIG. 5 shows the polarization-resolved electroluminescence intensities for B4745, an LED having a compressively strained active region emitting at about $\lambda$=250 nm. Unlike conventional devices that follow the polarization ratio trend described earlier and illustrated by the points along the dashed line of FIG. 4, the B4745 device shows strong relative emission in the preferred TE-polarization direction. The enhanced TE-polarization was achieved by growing the light emitting region of B4745 under compressive strain. Strong compressive strain in the light emitting region alters the band structure, and can push the light emission characteristics toward TE-polarization mode as can be observed from FIGS. 4 and 5.

Figure 6:
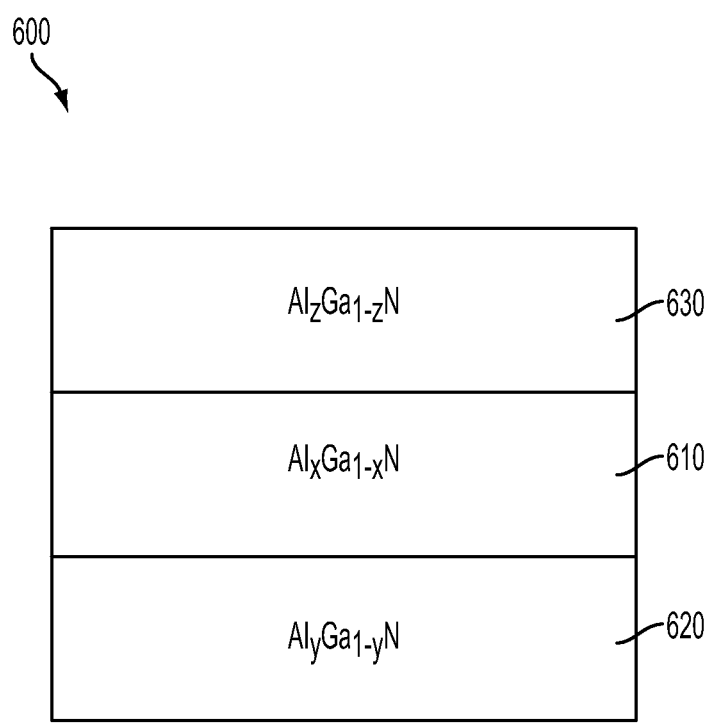
FIG. 6 is a diagram illustrating a light emitting layer disposed between two barrier layers according to embodiments discussed herein.

FIG. 6 is a diagram of layers of a light emitting region 600. The light emitting region 600 may comprise InAlN, AlGaN, and/or InAlGaN, for example. The central quantum well (QW) layer 610 can be compressively strained which supports enhanced TE polarization. In this example, the light emitting region 600 includes a central $Al_xGa_{1-x}N$ QW layer 610 disposed between first and second barrier layers 620, 630. In FIG. 6, the first barrier layer 620 has composition $Al_yGa_{1-y}N$ and the second barrier layer has composition $Al_zGa_{1-z}N$, where y may be equal to z for some embodiments. The Al content in the barrier layers 620, 630 serves to achieve confinement of the holes to the QW layer 610. The Al content in the barrier layers and/or the difference between the Al content of the barrier layers and the Al content of the QWs may also influence $P_D$, as discussed below.

The strain, $\epsilon_a$ of the QW 610 of the light emitting region 600 may be expressed:

$$\epsilon_a = (a_{strained} - a_{relaxed})/a_{relaxed} \quad [2]$$

where $a_{relaxed}$ is the in-plane lattice constant of fully relaxed $Al_xGa_{1-x}N$ and $a_{strained}$ is the actual strained in-plane lattice constant of the QW 610. Note that according to Equation 2, compressive strain is a negative quantity. Calculations support the conclusion that strain in the active region less than (more compressive than) certain values can provide TE dominant light emission ($P_D$>0) and/or can achieve enhanced $P_D$ values >0 as set forth in connection with FIG. 4. The strain that achieves enhanced $P_D$ depends on the wavelength of the emitted light and also on the Al composition in the barrier layers 620, 630.

Figure 7:
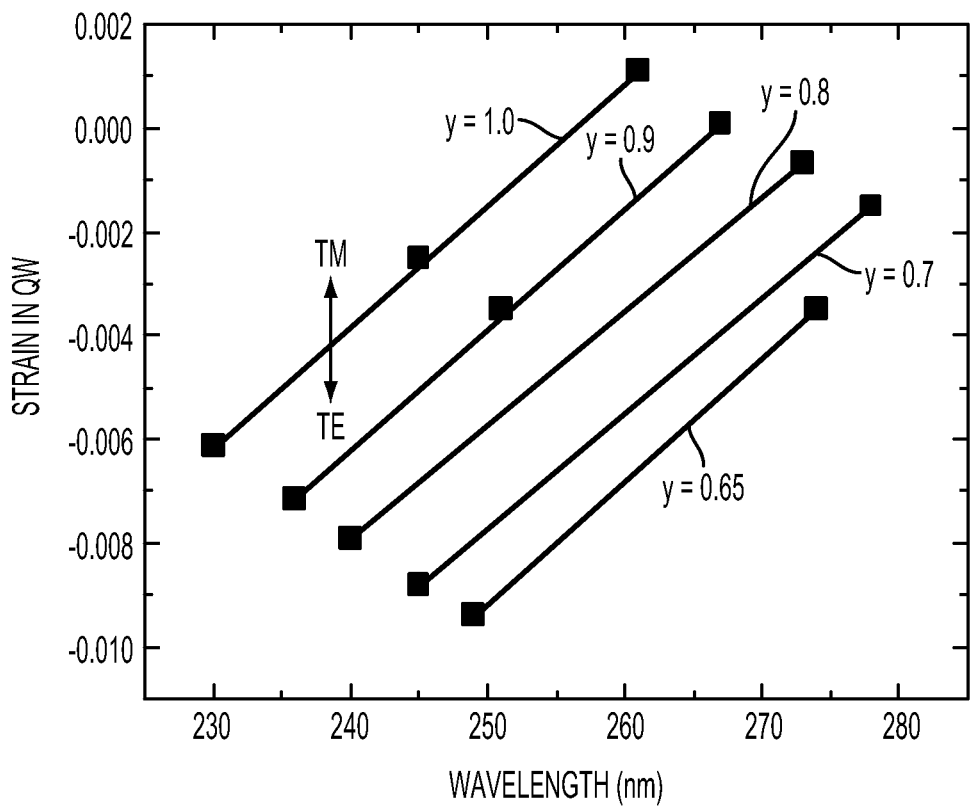
FIG. 7 illustrates the compressive strain that may be used to achieve dominant TE polarization at the specified wavelength for five barrier layer Al compositions according to embodiments discussed herein.

The lines of FIG. 7 correspond to the strain that may be used to achieve dominant TE polarization at the specified wavelength for 5 barrier layer Al compositions, y=0.65, 0.7, 0.8, 0.9, and 1.0. If the strain in the QW, $\epsilon_a$, is below the line then TE polarized emission is possible for the Al composition of the barriers, y, indicated. The compressive strain that supports TE polarized emission depends on the Al composition in the barriers, y, where both barrier layers have the same Al composition. Table 1 summarizes, for various amounts of Al content in the barriers, y, the strain in the QW, $\epsilon_a$, that may be used to achieve dominant TE polarized emission as a function of $\lambda$.

TABLE 1

| y | $\epsilon_a$ |
|---|---|
| 0.65 | < −0.0094 + 0.00023 * (λ(nm) − 249 nm) |
| 0.7 | < −0.0088 + 0.00022 * (λ(nm) − 245 nm) |
| 0.8 | < −0.0079 + 0.00022 * (λ(nm) − 240 nm) |
| 0.9 | < −0.00715 + 0.00023 * (λ(nm) − 235 nm) |
| 1.0 | < −0.00615 + 0.00023 * (λ(nm) − 230 nm) |

Note that as defined herein, compressive strain is indicated by a negative strain, so strains that are less than values indicated in Table 1 (more negative) correspond to a greater amount of compressive strain.

The light emitting device may be formed using a variety of substrate materials, such as sapphire, GaN, AlN, AlGaN, InAlGaN, Si, SiC and/or other materials. FIG. 7 and Table 1 may generally be applied to light emitting regions for any substrate wherein structural relaxation occurs and the active region does not necessarily have the lattice constant of the substrate. The relaxation can occur by the introduction of dislocations during the growth of the light emitting layers (AlGaN layers).

In some embodiments, AlN is used as the substrate for the light emitting device and the light emitting region includes at least one $Al_xGa_{1-x}N$ region disposed between two $Al_yGa_{1-y}N$ regions where $1 \geq y > x$. In these embodiments, the compressive strain of the light emitting region that achieves enhanced $P_D$ can be expressed as a function of the difference between the lattice constant of the AlN substrate, $a_{bulk-AlN}$, and the lattice constant of the $Al_xGa_{1-x}N$ QW, $a_{strained}$. For example, in some embodiments, enhanced $P_D$ may be achieved when $a_{strained} - a_{bulk-AlN} < 0.01$ Å.

Figure 8:
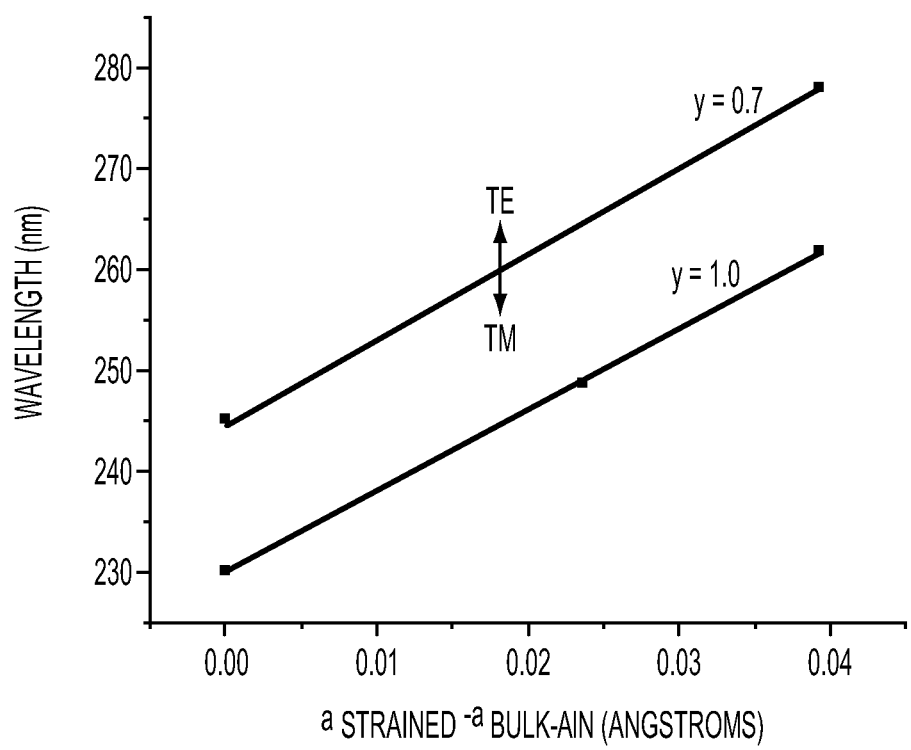
FIG. 8 illustrates the difference between the lattice constant of the quantum wells and the lattice constant of the substrate, $a_{strained} - a_{bulk-AlN}$, that achieves an enhanced degree of polarization for two barrier layer Al compositions according to embodiments discussed herein.

The lines of FIG. 8 correspond to the difference between the lattice constant of the QWs and the lattice constant of the substrate, $a_{strained} - a_{bulk-AlN}$, that achieves enhanced $P_D$ at the specified wavelength for two barrier layer Al compositions, y=0.7 and y=1. The strain in the QWs of the light emitting region for enhanced $P_D$ can depend on the aluminum content of the barrier layers, y, or the difference between the Al molar fraction in the barriers, y, and the Al content, x, of the QWs. From FIG. 8, when y=1.0, enhanced $P_D$, e.g., TE dominant polarization, is achieved when the difference in lattice constants is $a_{strained} - a_{bulk-AlN} \leq (\lambda$ (nm)−230)*0.0012 Å. When y=0.7, enhanced $P_D$, e.g., TE dominant polarization, is achieved when the difference in lattice constants is $a_{strained} - a_{bulk-AlN} \leq (\lambda$ (nm)−245)*0.0012 Å.

The Al content of the barrier, y, that can be used to achieve enhanced $P_D$ for a given value of λ for an $Al_xGa_{1-x}N$ QW and AlN bulk crystalline substrate can be expressed, $$y > 1 - 0.02 * \{\lambda \text{ [nm]} - 230 \text{ [nm]} - (a_{strained} \text{ [Å]} - a_{bulk-AlN} \text{ [Å]})/0.0012\}. \quad [3]$$

For the case that the growth is pseudomorphic, then ($a_{strained} = a_{bulk-AlN}$). In the pseudomorphic case, an Al content in the barrier of at least y=0.7 may be used in a device designed to emit enhanced $P_D$ light at a wavelength of around 245 nm. If some relaxation takes place, so that $a_{strained} - a_{bulk-AlN} > 0$, then according to Equation 3 a somewhat larger barrier composition may be used. In some devices emission of enhanced $P_D$ light may be achieved if y−x>0.05, but for devices designed to emit enhanced $P_D$ light at a wavelength λ below 245 nm it may be beneficial to increase the Al content in the barrier so that it meets both constraints A) y>x and B) y>0.7+0.02*(245−λ (nm)). Note that if x is 0.65 then λ would be about 245 nm so constraint B stipulates that y>0.7 If x=0.625 then both constraints stipulate y>0.625. If x=0.6, then λ would be about 252 nm and constraint A stipulates that y>0.6. Thus, emission of short wavelength TE polarized light can be achieved by using higher Al composition in the barriers. Somewhere between about λ=252 and λ=245 nm increasing Al composition in the barriers contributes more substantially to TE polarization.

Figure 9:
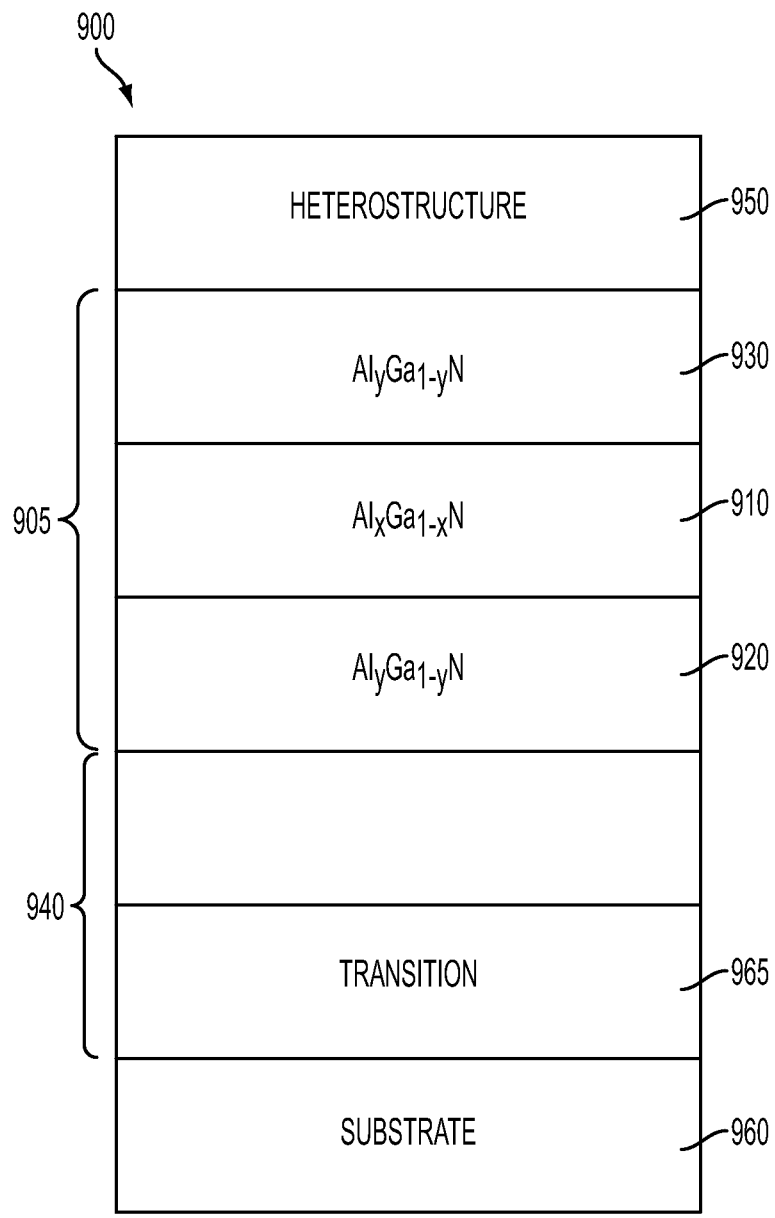
FIG. 9 illustrates a light emitting device having a light emitting region comprising one or more compressively strained $Al_xGa_{1-x}N$ layers disposed between $Al_yGa_{1-y}N$ barrier layers and heterostructures disposed on either side of the light emitting region to enhance the crystal quality of the epitaxially grown layers of the light emitting region according to embodiments herein.

FIG. 9 illustrates a light emitting device 900 having a light emitting region 905 comprising one or more compressively strained $Al_xGa_{1-x}N$ layers 910 disposed between $Al_yGa_{1-y}N$ barrier layers 920, 930. Heterostructures 940, 950 disposed on either side of the light emitting region 910 enhance the crystal quality of the epitaxially grown layers 910, 920, 930 of the light emitting region 905. A first heterostructure 940 is formed over a substrate 960, and includes transition region 965. Note that in FIG. 9 a light emitting region 905 comprising a single barrier layer-QW-barrier layer structure is illustrated, the light emitting region may include multiple QWs, each QW disposed between barrier layers in a barrier layer-QW-barrier layer structure. For example, a light emitting diode may include 2, 3, 4, or more QWs.

Figure 10:
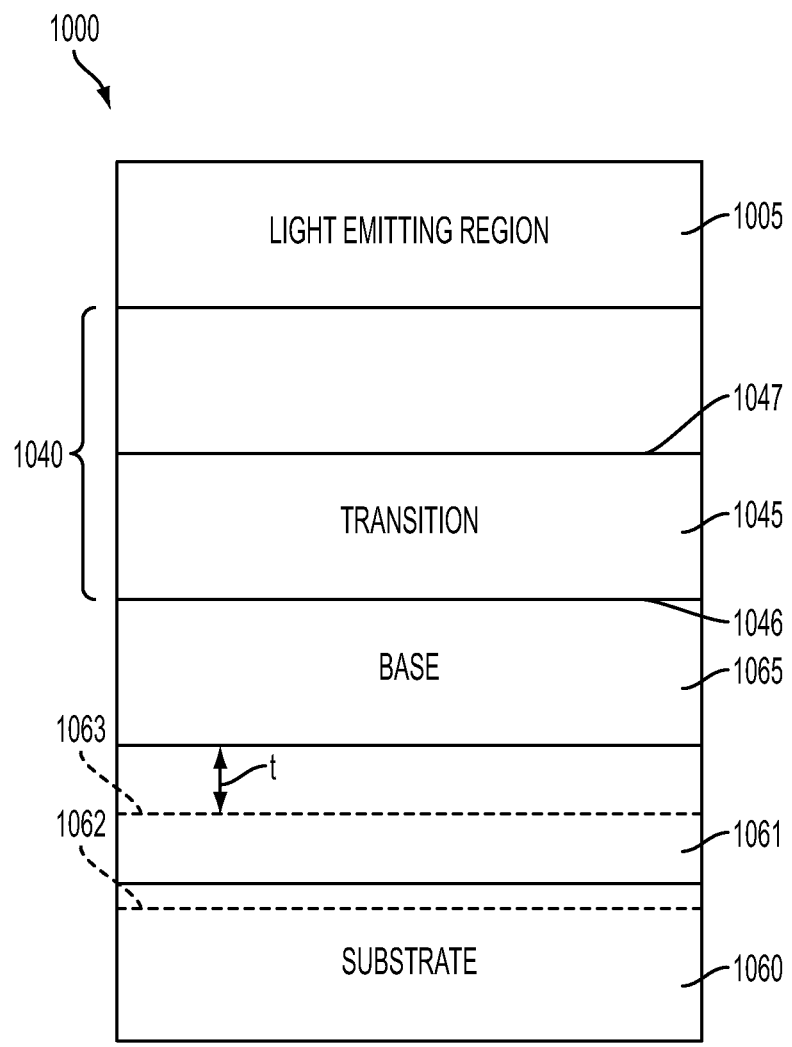
FIG. 10 illustrates a device that includes a first heterostructure having a transition layer according to embodiments discussed herein.

Referring to the diagram of FIG. 10, the first heterostructure 1040 may include one or more transition layers 1045 disposed between the light emitting region 1005 and the substrate 1060. As previously discussed, a second heterostructure (e.g., as indicated by 950 of FIG. 9) is grown over the light emitting region 1005. The transition layers of the first heterostructure 1040 serve to further enhance crystal quality of the light emitting device 1000. For example, the transition layers may be AlGaN/AlGaN short period superlattices or one or more graded AlGaN layers that change in aluminum content going from the substrate toward the active region. In some implementations, a graded AlGaN transition layer 1045 may be grown with a first surface 1046 towards the substrate and a second surface 1047 towards the light emitting region 1005, wherein the Al content changes (increases or decreases) from the transition layer first surface 1046 to the transition layer second surface 1047. Optionally, a base layer 1065 may be present between the substrate 1060 and the transition layer 1045. The base layer 1065 can provide a template upon which the first heterostructure is grown. Suitable materials for the base layer include $Al_{zbase}Ga_{1-zbase}N$, where zbase is between 0 and 1.

If the base layer is lower in Al content than the light emitting region, then the Al content in the transition layer may increase from the base layer toward the light emitting region. If the base layer is higher Al content than the light emitting region, then the Al content in the transition layer may decrease from the base layer toward the light emitting region.

In some configurations, the substrate 1060, e.g., a bulk AlN substrate, may be too optically absorbing to allow efficient extraction of light from the bottom of the device 1000. In these configurations, light extraction can be enhanced by growing an optional layer 1061 on the AlN substrate 1060. For example, the optional layer 1061 may be a relatively thick pseudomorphic AlN layer grown homoepitaxially on the bulk AlN substrate 1060. The homoepitaxially grown AlN layer 1061 is non-absorbing at the desired wavelength of the device 1000. In some cases, the optional layer 1061 may be an epitaxially grown layer comprising AlGaN, such as an AlGaN layer or an AlGaInN layer. Most or all of the substrate 1060 or all of the substrate 1060 and a portion of the optional layer 1061 may be etched away, e.g., as indicated by dashed lines 1062 and 1063, respectively. The thickness, t, of the a portion of the homoepitaxially grown AlN layer 1061 that remains with the device 1000 after the etching is sufficient to maintain the compressive strain that provides dominant TE polarized light emission from the light emitting region 1005. For example, the compressive strain for a device that produces dominant TE polarized light and having a removed AlN substrate may satisfy the equation: $a_{strained} - a_{bulk-AlN} \leq (\lambda$ (nm) $-230) * 0.0012$ Å. When an epitaxial AlGaN or AlGaInN optional layer is used, the optional layer 1061 may be relatively thin and the amount of Ga and/or In may be relatively small in order to reduce wafer bowing once the bulk AlN substrate is removed.

Figure 11:
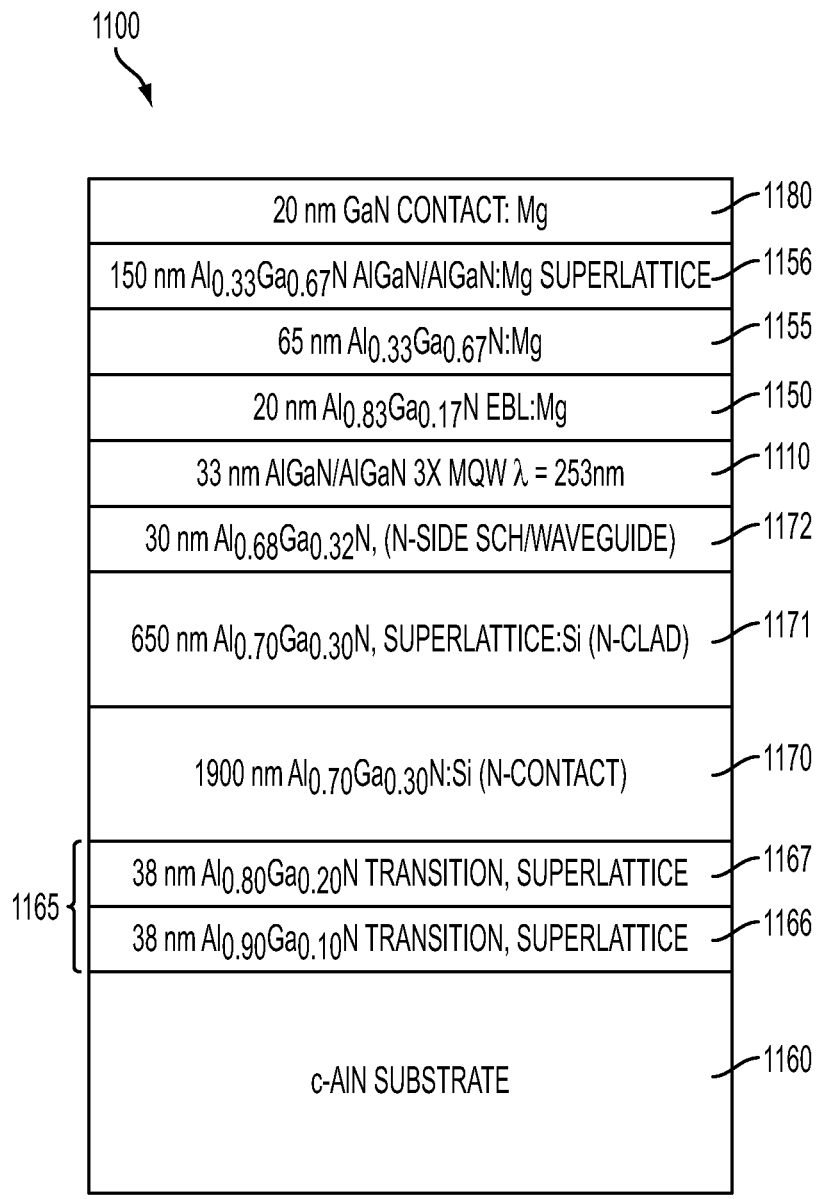
FIG. 11 shows the various layers and layer compositions of an example of a light emitting device in accordance with embodiments described herein.

FIG. 11 shows the various layers and layer compositions of an example of a light emitting device 1100. In this example, the device includes a bulk crystalline AlN substrate 1160. Epitaxially grown on the bulk AlN substrate is a transition region 1165 comprising two 38 nm-thick short period superlattice (SPSL) sections 1166, 1167. The first, substrate-side, section contains an average aluminum molar fraction of 90%. The second section is grown above the first section and contains an average aluminum content of 80%. The superlattice in the second section has a thinner AlN component than the first section to produce the lower average aluminum alloy composition. The transition layer 1165 serves to transition the Al content of the device from the (relatively high Al content) AlN substrate 1160 toward the (lower Al content) light emitting region 1110 to maintain pseudomorphic growth of AlGaN light emitting region. The light emitting region 1110 is thus compressively strained towards conformation with the lattice of the AlN substrate 1160. In this example, the transition layer 1165 decreases in Al content from the AlN substrate 1160 towards the light emitting region 1110.

A 1900 nm $Al_{0.70}Ga_{0.30}N$ silicon doped n-contact layer 1170 is disposed on the transition layer 1165 followed by an n-cladding layer 1171 comprising a 650 nm $Al_{0.70}Ga_{0.30}N$ Si doped superlattice. The light emitting region 1110 and an electron blocking layer (EBL) 1150 are disposed between an n-side separate confinement heterostructure (SCH) 1172 and p-side current spreading layer 1155. In the example of FIG. 11, the n-side SCH 1172 comprises a 30 nm $Al_{0.68}Ga_{0.32}N$ layer, and the p-side current spreading layer 1155 comprises a 65 nm layer of Mg doped $Al_{0.33}Ga_{0.67}N$. In this example, the EBL 1150 is a 20 nm Mg doped $Al_{0.83}Ga_{0.17}N$ layer. The light emitting layer 1110 comprises three $Al_xGa_{1-x}N$ quantum well layers alternating with $Al_yGa_{1-y}N$ barriers. The Al content, x, of the QWs is sufficient to achieve a central wavelength of $\lambda=253$ nm. The Al content, y, of the barriers, as previously discussed, is selected to compressively strain the QWs so that emission of TE-polarized light from the light emitting region 1110 is predominant. The light emitting device 1100 includes a p-cladding/current spreading layer 1156 comprising a 150 nm AlGaN/AlGaN Mg doped superlattice having an average composition of $Al_{0.33}Ga_{0.67}N$ disposed above the current spreading layer 1155. A 20 nm p-contact layer 1180 comprising Mg doped GaN is disposed on the current spreading layer 1156.

Figure 12:
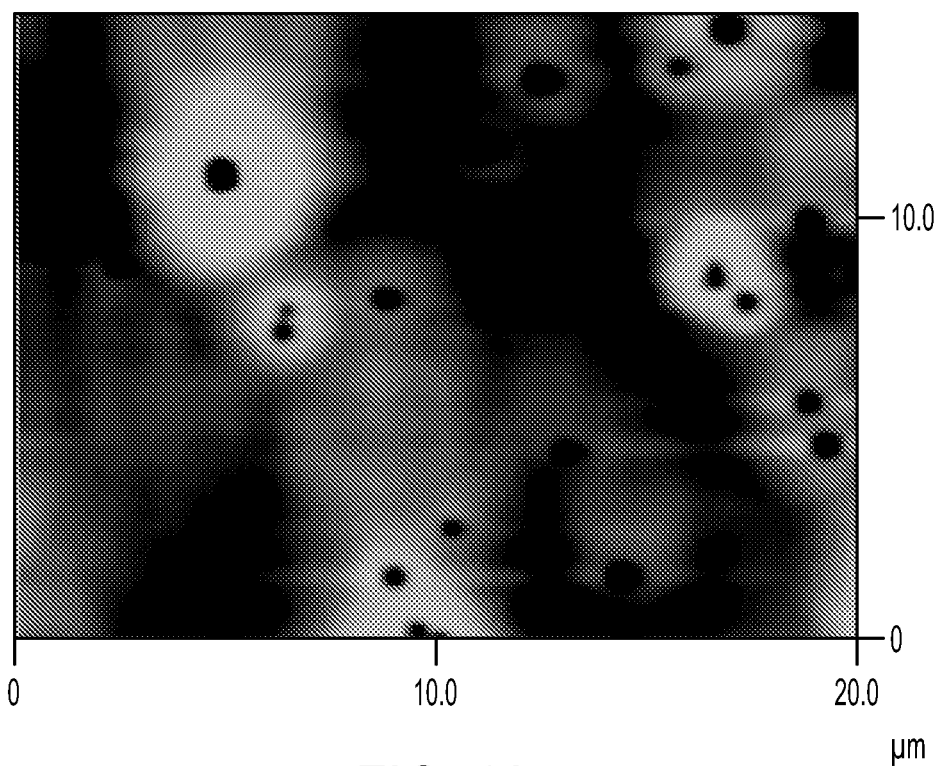
FIGS. 12 and 13 show surface atomic force microscopy (AFM) scans of the heterostructure of FIG. 11 grown up to the n-contact layer, without (FIG. 12) and with (FIG. 13) transition layers.
Figure 13:
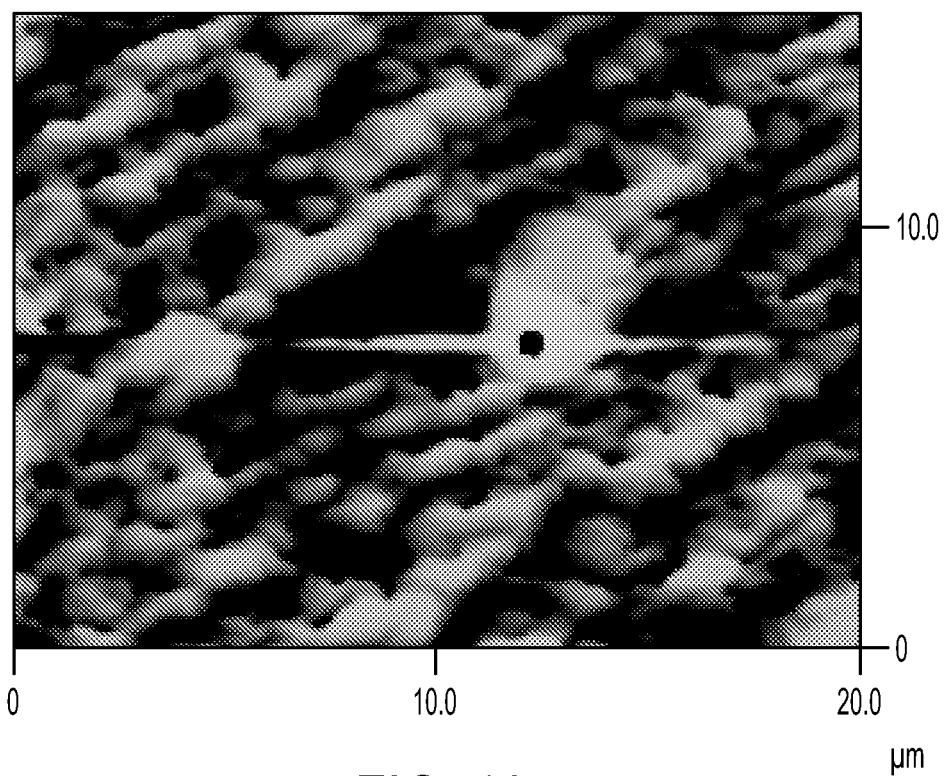

As previously discussed, the transition layers are included in the device structure to enhance crystal quality of the device. FIGS. 12 and 13 show surface atomic force microscopy (AFM) scans of the heterostructure in FIG. 11 grown up to the n-contact layer, without (FIG. 12) and with (FIG. 13) transition layers. The structure shown in FIG. 12 without the transition layer is optically hazy, is rough, and has many more hexagonal pits compared to the structure with transition layers shown in FIG. 13. Using transition layers allows for the growth of device structures (up to the n-contact layer) having a surface roughness of less than about 15 nm, or less than about 10 nm or even less than about 5 nm.

Figure 14:
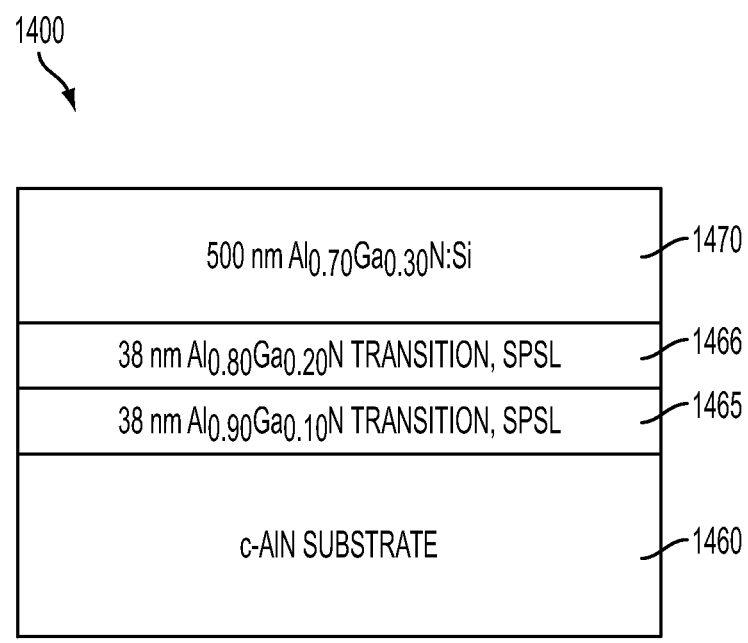
FIG. 14 illustrates a $Al_{0.7}Ga_{0.3}N$ layer grown over a bulk crystalline AlN substrate with two 38 nm transition layers comprising short period superlattices (SPSLs) disposed between the AlN substrate and the $Al_{0.7}Ga_{0.3}N$ layer in accordance with some embodiments.
Figure 15:
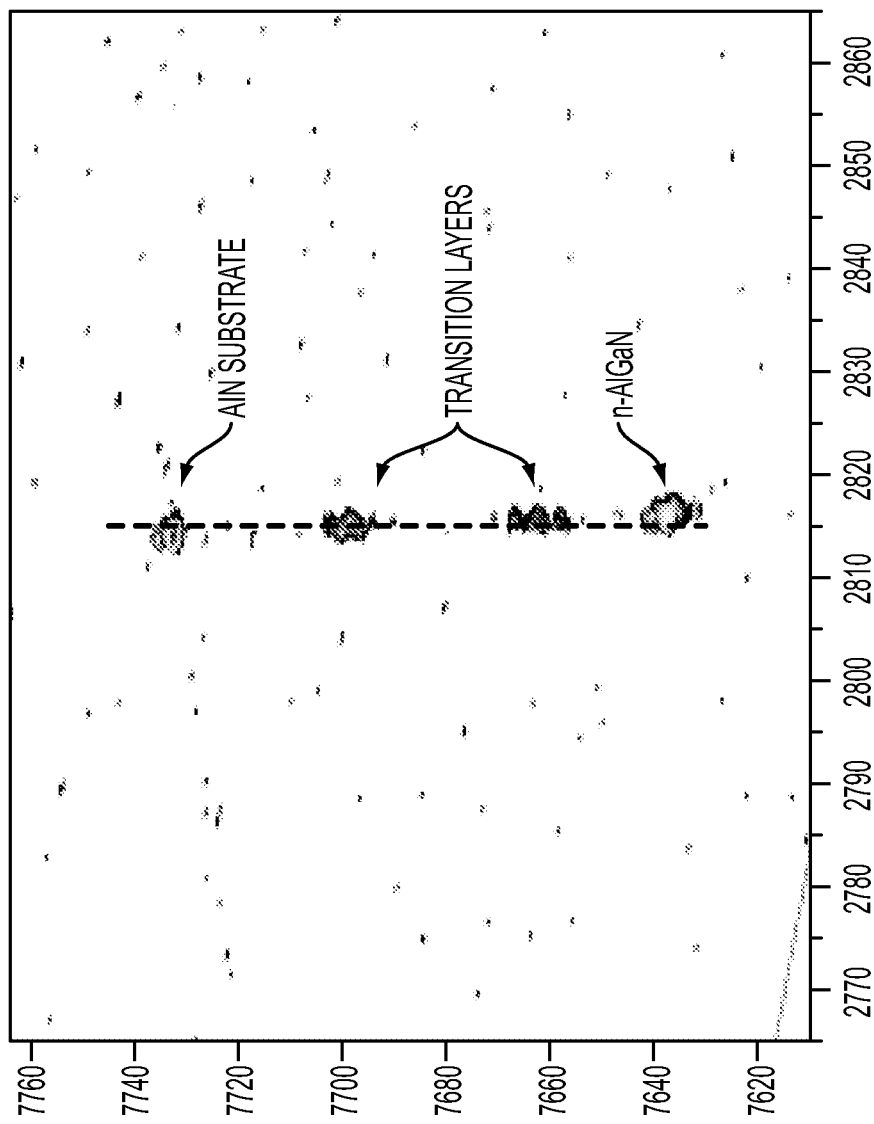
FIG. 15 shows an X-ray reciprocal space map of the structure shown in FIG. 14.

FIG. 15 shows an X-ray reciprocal space map of the structure 1400 shown in FIG. 14. FIG. 14 illustrates a $Al_{0.7}Ga_{0.3}N$ layer 1470 grown over a bulk crystalline AlN substrate 1460. Two 38 nm-thick transition layers comprising short period superlattices (SPSLs) 1465, 1466 are disposed between the AlN substrate 1460 and the $Al_{0.7}Ga_{0.3}N$ layer 1470. The first, substrate-side, SPSL 1465 contains an average aluminum molar fraction of 90%. The second SPSL 1466 is grown above the first SPSL 1465 and contains an average aluminum content of 80%.

FIG. 15 is the reciprocal space map acquired by x-ray diffraction analysis of structure 1400. The peaks for the transition layers and the AlGaN layer all line up along the same Qx value as that of the substrate indicating a close lattice match in the layers. This characteristic demonstrates pseudomorphic growth resulting in an amount of compressive strain that produces TE-dominant LED emission. For example, in some cases, TE polarized light is dominant when the variation in reciprocal lattice values of the AlN substrate and the light emitting region is less than about 1.5%.

Figure 16:
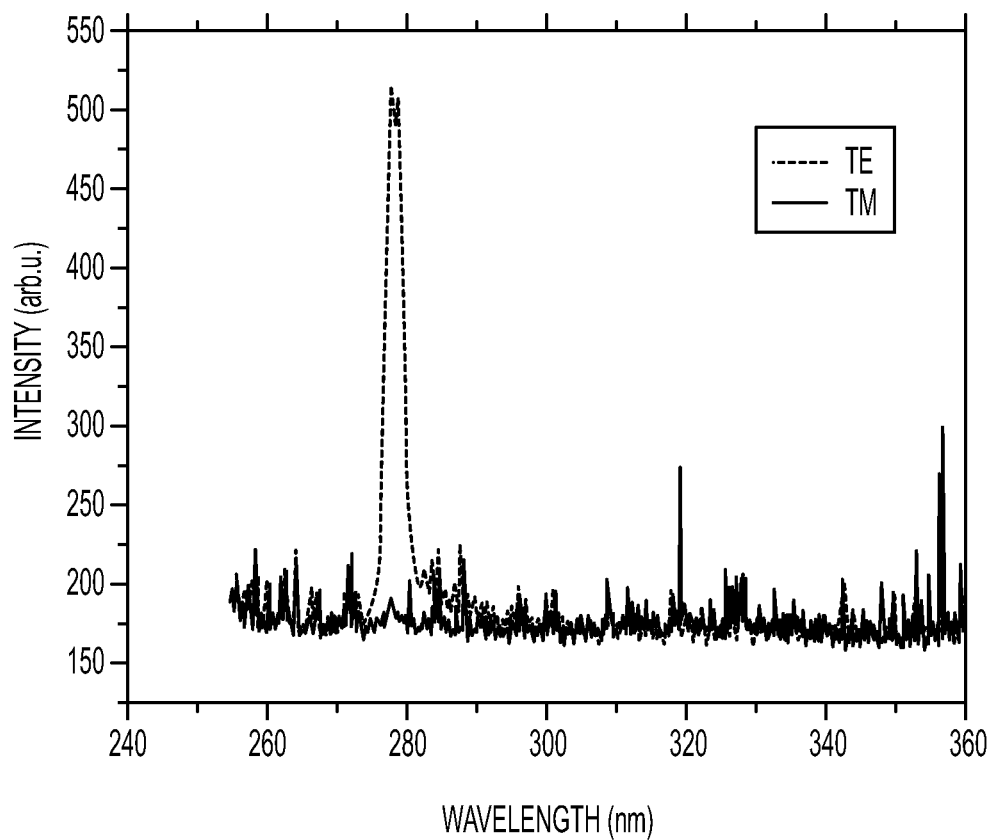
FIG. 16 shows the polarization-resolved spectrum of a $\lambda = 279$ nm laser exhibiting an enhanced degree of polarization in accordance with embodiments described herein.
Figure 17:
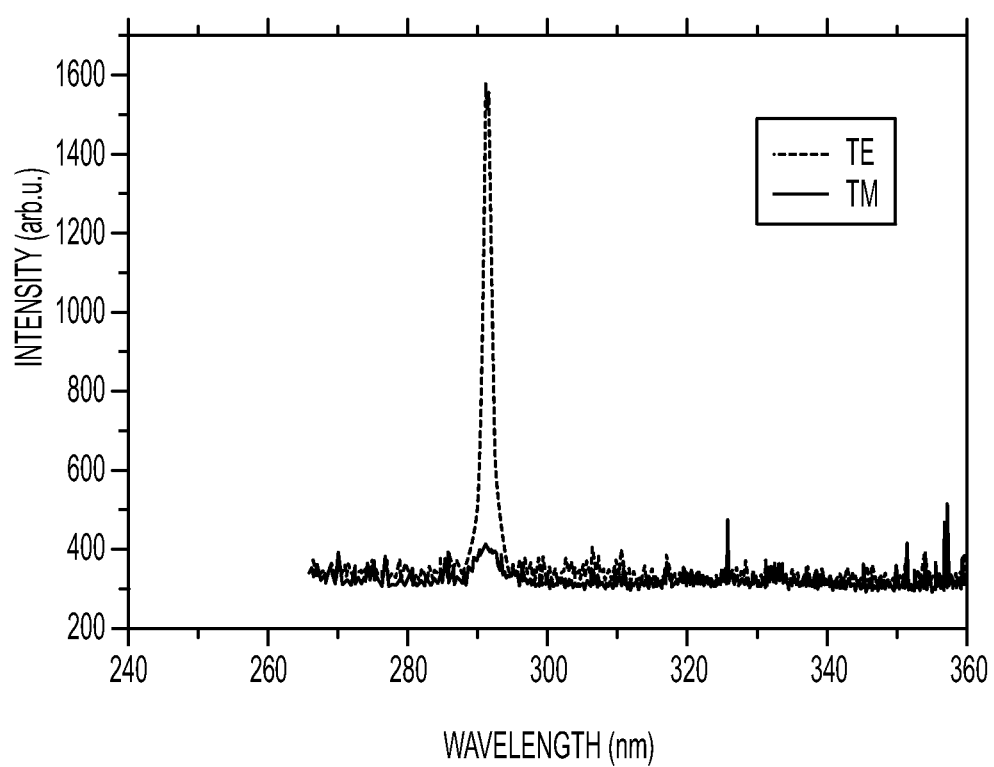
FIG. 17 shows the polarization-resolved spectrum of $\lambda = 290$ nm laser exhibiting an enhanced degree of polarization in accordance with embodiments described herein.

In addition to $\lambda=250$ nm light emitting diodes, shown schematically in FIG. 11 and having the photoluminescence plot provided in FIG. 5, additional devices having active layers operating at $\lambda=279$ and at $\lambda=290$ nm were designed, grown, fabricated, and evaluated. Like the $\lambda=250$ nm demonstration, these longer wavelength devices were grown under high compressive strain on AlN substrates. However, they use a different transition layer comprising a graded AlGaN layer with aluminum composition that monolithically decreases from 100% to 70% instead of the superlattice transition layers illustrated in FIG. 11. Photoluminescence data from these longer wavelength devices show the desired TE-dominant light emission. Photo-pump lasers made from these devices emit light with TE-dominant polarization both below and above the lasing threshold. FIG. 16 shows the polarization-resolved spectrum of the $\lambda=279$ nm laser and FIG. 17 shows the polarization-resolved spectrum of the $\lambda=290$ nm laser.

Compressive strain in the light emitting region of a light emitting device can be designed to enhance TE-polarized emission. Additionally, the light emitting region quantum well thickness, barrier thickness, and barrier composition also influence the band structure and the nature of energy transitions. The well width, barrier width, and barrier composition can also be adjusted to tune the polarization ratio. UV light emitting structures that exhibit enhanced $P_D$ light emission have been attained by growing the light emitting region under compressive strain and/or tuning the barrier Al content. Despite the large strain, crystal quality may be maintained by using superlattices and/or graded transition layers between the heterostructure and the substrate.

Figure 18:
FIG. 18 shows the layers of a light emitting diode emitting light at $\lambda = 291$ nm with enhanced $P_D$ light emission according to embodiments discussed herein.

FIG. 18 is a flow diagram of a method of forming a light emitting device capable of emitting light having enhanced degree of polarization, $P_D$. A first heterostructure is grown 1810 on a substrate. A light emitting region 1845 is grown over the first heterostructure. The light emitting region is grown so that the compressive strain in the light emitting region satisfies the inequality $\epsilon_a < -0.00615 + 0.00023 * (\lambda$ (nm)$-230$ nm) for $y \leq 1$. A second heterostructure is grown over the light emitting region.

EXAMPLE

FIG. 18 shows the layers 1805-1865 of an example light emitting diode 1800 emitting light at a central wavelength, $\lambda=291$ nm, and with enhanced $P_D$ light emission as discussed herein. The device 1800 was produced by growing layers 1810-1865 by metal organic chemical vapor deposition (MOCVD) on a bulk crystalline AlN substrate 1805. A 54 nm initiation or base layer 1810 comprising undoped MOCVD grown AlN was grown on the bulk AlN substrate 1805. Defect reduction layers/transition layers (DRL1 and DRL2) comprise a 60 pair AlN/GaN superlattice having an average composition of $Al_{0.89}Ga_{0.11}N$ 1815 and thickness 144 nm 1815 and a 101 pair AlN/GaN superlattice having an average composition of $Al_{0.78}Ga_{0.22}N$ and a thickness of 271 nm 1820. A 315 nm n-contact base layer 1825 comprising $Al_{0.74}Ga_{0.26}N$ and a Si doped 484 nm $Al_{0.74}Ga_{0.26}N$ n-contact layer 1830 were grown over the transition layers as depicted in FIG. 18. Next grown was an n-cladding layer 1835 comprising a Si doped 78-pair AlGaN superlattice having a total thickness of 504 nm and an average composition of $Al_{0.74}Ga_{0.26}N$. An n-waveguide 1840 comprising 33 nm Si doped $Al_{0.59}Ga_{0.41}N$ was grown over the n-cladding superlattice. The light emitting region 1845 comprises three 3.8 nm QWs comprising $Al_{0.44}Ga_{0.56}N$ layer disposed between 5.3 nm barrier layers comprising $Al_{0.57}Ga_{0.43}N$. The p-side of the device includes a 5.9 nm p-waveguide 1850 comprising $Al_{0.59}Ga_{0.41}N$ and a 367 nm p-cladding layer 1855. The p-cladding layer 1855 comprises a 200 pair AlGaN/AlGaN superlattice having an average composition $Al_{0.85}Ga_{0.15}N$. The Al content is graded in layer 1860 from molar fraction 0.65 to 0. Layer 1865 is the p-contact layer. Table 2 below provides a summary of parameters used for growing layers 1810-1865. In Table 2, the following abbreviations are used: DRL=defect reduction layer, BA=barrier, QW=quantum well, TMG=trimethylgallium, TEG=triethylgallium, TMA=trimethylaluminum, CP2Mg=Bis(cyclopentadienyl) magnesium, sccm=standard cubic centimeters per minute.

for example, the wavelength ranges provided herein may be viewed in terms of the Al content in the light emitting region which corresponds to these wavelength ranges. For example, the wavelength range between 200 nm and 400 nm generally corresponds to an Al molar fraction range between about 0 and 1; the wavelength range between 200 nm and 300 nm generally corresponds to an Al molar fraction range between about 0.32 and 1. Note that growing pseudomorphic $Al_xGa_{1-x}N$ on AlN can become more difficult as x is reduced. However, low x AlGaN could relax (so that it is no longer pseudomorphic to AlN) and still be compressively strained, producing light having an enhanced degree of polarization as described herein. Light emitting devices according to some embodiments may be described in terms of the compressive strain and Al content of the active region. For example, a light emitting device according to the approaches herein may comprise at least one compressively stained layer of $Al_xGa_{1-x}N$, wherein 0.5<x<0.8, and wherein a compressive strain, $\epsilon_a$, in the compressively strained layer satisfies the inequality $\epsilon_a < -0.00615$.

A number of values and ranges are provided in various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various facets of the imple-

TABLE 2

| Layer | | | Time (sec) | Temp (° C.) | Pressure (torr) | TMG/TEG (sccm) | TMA (sccm) | NH3 (sccm) | SiH4 (sccm) | CP2Mg (sccm) | Carrier |
|---|---|---|---|---|---|---|---|---|---|---|---|
| 1810 | | AlN undoped | 900 | 1125 | 200 | | 10 | 4 | | | H |
| 1815 | | DRL 1 AlN | 31 | 1100 | 200 | | 10 | 4 | | | H |
| 1815 | 60x | DRL 1 GaN | 5 | 1100 | 200 | 5 | | 4 | | | H |
| 1820 | | DRL 2 AlN | 12 | 1100 | 200 | | 10 | 4 | | | H |
| 1820 | 101x | DRL 2 GaN | 5 | 1100 | 200 | 5 | | 4 | | | H |
| 1825 | | nCont, undoped | 1800 | 1100 | 200 | 4 | 95 | 4 | | | H |
| 1830 | | nCont | 2700 | 1100 | 200 | 4 | 95 | 4 | 2 | | H |
| 1835 | | nClad, xHi | 16 | 1100 | 200 | 4 | 100 | 4 | 2 | | H |
| 1835 | 68x | nClad, xLo | 20 | 1100 | 200 | 4 | 90 | 4 | 2 | | H |
| 1835 | | nClad, xHi | 16 | 1100 | 200 | 4 | 100 | 4 | 2 | | H |
| 1835 | 10x | nClad, xLo | 20 | 1100 | 200 | 4 | 90 | 4 | 2 | | H |
| 1840 | | nGuide | 1380 | 900 | 700 | 64 | 10 | 5 | 0.8 | | N |
| 1845 | | BA:un | 55 | 900 | 700 | 64 | 8 | 5 | | | N |
| 1845 | | BA:Si | 111 | 900 | 700 | 64 | 8 | 5 | 1 | | N |
| 1845 | | BA:un | 55 | 900 | 700 | 64 | 8 | 5 | | | N |
| 1845 | | QW1 | 160 | 900 | 700 | 64 | 3.5 | 5 | | | N |
| 1845 | | BA:un | 55 | 900 | 700 | 64 | 8 | 5 | | | N |
| 1845 | | BA:Si | 111 | 900 | 700 | 64 | 8 | 5 | 1 | | N |
| 1845 | | BA:un | 55 | 900 | 700 | 64 | 8 | 5 | | | N |
| 1845 | | QW2 | 160 | 900 | 700 | 64 | 3.5 | 5 | | | N |
| 1845 | | BA:un | 55 | 900 | 700 | 64 | 8 | 5 | | | N |
| 1845 | | BA:Si | 111 | 900 | 700 | 64 | 8 | 5 | 1 | | N |
| 1845 | | BA:un | 55 | 900 | 700 | 64 | 8 | 5 | | | N |
| 1845 | | QW3 | 160 | 900 | 700 | 64 | 3.5 | 5 | | | N |
| 1845 | | BA:un | 55 | 900 | 700 | 64 | 8 | 5 | | | N |
| 1845 | | BA:Si | 111 | 900 | 700 | 64 | 8 | 5 | | | N |
| 1845 | | BA:un | 55 | 900 | 700 | 64 | 8 | 5 | | | N |
| 1850 | | pGuide | 246 | 900 | 700 | 64 | 10 | 5 | | | N |
| 1855 | | pClad, xHi | 50 | 900 | 200 | | 3 | 4 | | | H |
| 1855 | 200x | pClad, xLo | 25 | 900 | 200 | 0.5 | 3 | 4 | | 25 | H |
| 1860 | | pGrad AlGaN | 5 | 900 | 200 | 5 | 60 | 4 | | 100 | H |
| 1860 | ramp | pGrad AlGaN | 333 | 900 | 200 | 5 | 60 → 0 | 4 | | 100 | H |
| 1865 | | GaN:Mg | 100 | 900 | 200 | 5 | | 4 | | 100 | H |

Figure 19:
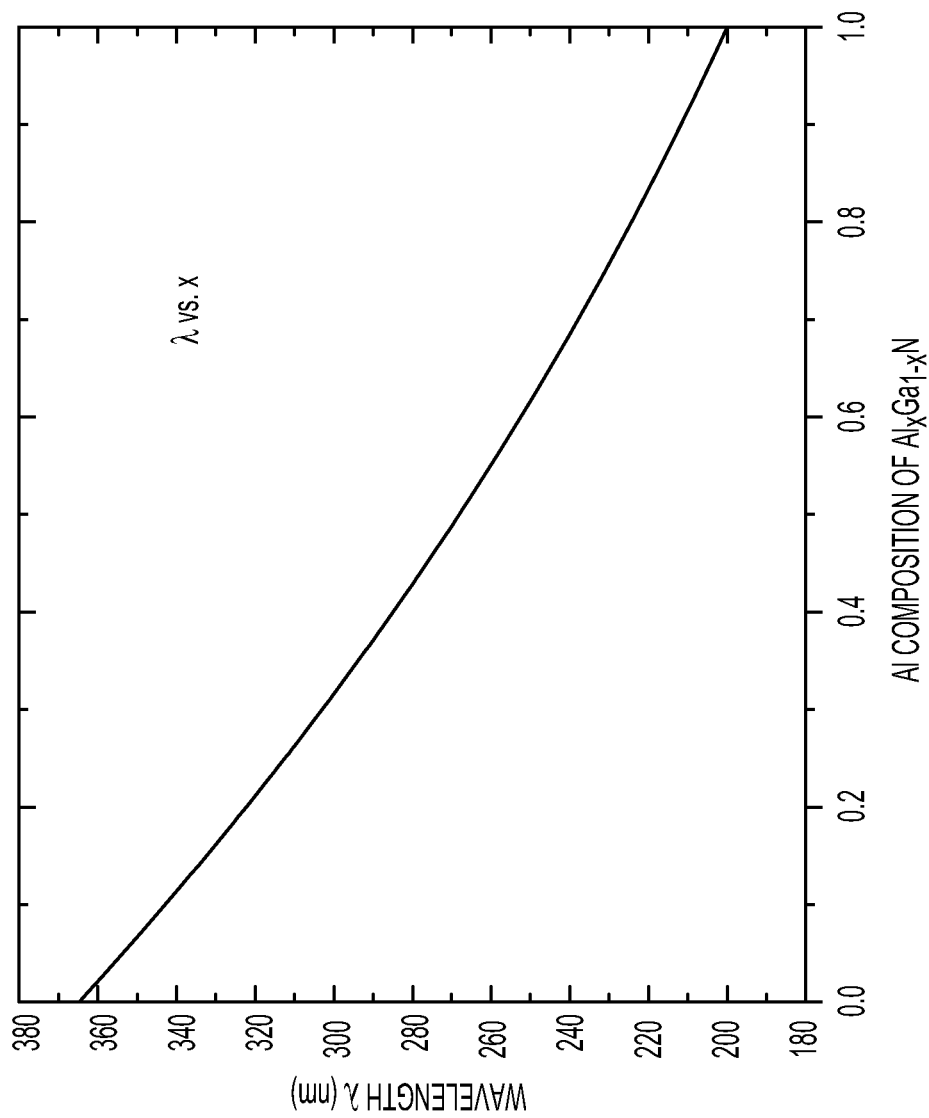
FIG. 19 is a graph that shows the relationship between Al content and wavelength for $Al_xGa_{1-x}N$.

Light emitting devices described in examples provided herein are based on compressively strained III-nitride material systems. FIG. 19 shows a relationship between the Al content of $Al_xGa_{1-x}N$ and emission wavelength. It will be appreciated that, using the relationship provided in FIG. 19, mentations. These materials are to be treated as exemplary, and are not intended to limit the scope of the claims. The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

The invention claimed is:

1. A light emitting device, comprising:
a bulk crystalline AlN substrate; and
a light emitting region, disposed above the bulk crystalline AlN substrate and comprising:
at least one compressively strained $Al_xGa_{1-x}N$ layer; and
two $Al_yGa_{1-y}N$ layers, the at least one compressively strained $Al_xGa_{1-x}N$ layer disposed between the two $Al_yGa_{1-y}N$ layers, wherein the compressively strained $Al_xGa_{1-x}N$ layer is configured to emit light having a central wavelength, $\lambda$, and a degree of polarization, $P_D$, wherein $P_D$ is greater than 0 and 231 nm<$\lambda$<250 nm, and the compressively strained $Al_xGa_{1-x}N$ layer has a strain, $\epsilon_a$, wherein y≥0.9 and $\epsilon_a$<−0.0065.

2. A light emitting device, comprising:
a bulk crystalline AlN substrate; and
a light emitting region, disposed above the bulk crystalline AlN substrate and comprising:
at least one compressively strained $Al_xGa_{1-x}N$ layer; and
two $Al_yGa_{1-y}N$ layers, the at least one compressively strained $Al_xGa_{1-x}N$ layer disposed between the two $Al_yGa_{1-y}N$ layers, wherein the at least one compressively strained $Al_xGa_{1-x}N$ layer is configured to emit light having a central wavelength, $\lambda$, and a degree of polarization, $P_D$, wherein $P_D$ is greater than 0 and 231 nm<$\lambda$<250 nm, and the $Al_xGa_{1-x}N$ layer has a strain, $\epsilon_a$, wherein
y>0.9, and $\epsilon_a$<−0.0065, if 250 nm>$\lambda$>240 nm; or
y>0.95, and $\epsilon_a$<−0.0075, if 240 nm>$\lambda$>231 nm.

3. A nitride-semiconductor light emitting device comprising:
a bulk crystalline AlN substrate;
a light emitting region disposed over the bulk crystalline AlN substrate and comprising:
at least one III-nitride quantum well layer; and
III-nitride barrier layers comprising $Al_yGa_{1-y}N$, where y≥0.9, the at least one III-nitride quantum well layer disposed between the III-nitride barrier layers, the at least one III-nitride quantum well layer being compressively strained and configured to emit light having a central wavelength, $\lambda$, and a degree of polarization, $P_D$, where $P_D$>0.006$\lambda$−b and 231 nm≤$\lambda$≤250 nm, wherein b≤1.5;
a base layer proximate the bulk crystalline AlN substrate;
a contact layer; and
a transition region between the base layer and the contact layer, the transition having an aluminum content.

4. The device of claim 3, wherein b is about 1.

5. The device of claim 3, wherein the light emitting region comprises at least one of GaN, InAlN, AlGaN, InGaN and InAlGaN.

6. The device of claim 3, wherein:
the bulk crystalline AlN substrate has a lattice constant, $a_{bulk-AlN}$;
the at least one III-nitride quantum well layer comprises at least one $Al_xGa_{1-x}N$ layer; and
the at least one $Al_xGa_{1-x}N$ layer has an in-plane lattice constant $a_{strained}$ and $a_{strained} - a_{bulk-AlN} \leq (\lambda \text{ (nm)} - 230) * 0.0012$ Å.

7. The device of claim 3, wherein the at least one III-nitride quantum well layer comprises at least one $Al_xGa_{1-x}N$ layer and wherein strain $\epsilon_a$ in the $Al_xGa_{1-x}N$ layer satisfies the inequality $\epsilon_a < -0.0079 + 0.00022*(\lambda \text{ (nm)} - 240 \text{ nm})$.

8. The device of claim 3, wherein the transition region comprises at least one of:
an AlGaN/AlGaN superlattice; and
an AlGaN layer having a first surface near the bulk crystalline AlN substrate and a second surface near the light emitting region, the AlGaN layer graded in Al content between the first surface and the second surface.

9. The device of claim 3, wherein the base layer comprises $Al_{zbase}Ga_{1-zbase}N$, where zbase is between 0 and 1.

10. A nitride-semiconductor light emitting device comprising:
a bulk crystalline AlN substrate;
a light emitting region disposed over the bulk crystalline AlN substrate and comprising:
at least one III-nitride quantum well layer; and
III-nitride barrier layers comprising $Al_yGa_{1-y}N$, where y≥0.9, the at least one III-nitride quantum well layer disposed between the III-nitride barrier layers, the at least one III-nitride quantum well layer being compressively strained and configured to emit light having a central wavelength, $\lambda$, and a degree of polarization, $P_D$, where $P_D$>0.006$\lambda$−b and 231 nm≤$\lambda$≤250 nm, wherein b≤1.5;
a base layer proximate the bulk crystalline AlN substrate;
a contact layer; and
a transition region between the base layer and the contact layer, the transition having an aluminum content that varies between the base layer and the contact layer.

11. The device of claim 10, wherein b is about 1.

12. The device of claim 10, wherein the at least one III-nitride quantum well layer comprises at least one of GaN, InAlN, AlGaN, InGaN and InAlGaN.

13. The device of claim 10, wherein:
the bulk crystalline AlN substrate has a lattice constant, $a_{bulk-AlN}$;
the at least one III-nitride quantum well layer comprises at least one $Al_xGa_{1-x}N$ layer; and
the at least one $Al_xGa_{1-x}N$ layer has an in-plane lattice constant $a_{strained}$ and $a_{strained} - a_{bulk-AlN} \leq (\lambda \text{ (nm)} - 230) * 0.0012$ Å.

14. The device of claim 10, wherein the at least one quantum well layer comprises at least one $Al_xGa_{1-x}N$ layer and wherein strain $\epsilon_a$ in the $Al_xGa_{1-x}N$ layer satisfies the inequality $\epsilon_a < -0.0079 + 0.00022*(\lambda \text{ (nm)} - 240 \text{ nm})$.

15. The device of claim 10, wherein the transition region comprises at least one of:
an AlGaN/AlGaN superlattice; and
an AlGaN layer having a first surface near the bulk crystalline AlN substrate and a second surface near the light emitting region, the AlGaN layer graded in Al content between the first surface and the second surface.

16. The device of claim 10, wherein the base layer comprises $Al_{zbase}Ga_{1-zbase}N$, where zbase is between 0 and 1.

17. A method of forming a light emitting device, comprising:
growing a light emitting region over a bulk crystalline AlN substrate wherein growing the light emitting region comprises growing at least one compressively-strained $Al_xGa_{1-x}N$ quantum well layer between two $Al_yGa_{1-y}N$ layers, the at least one compressively strained $Al_xGa_{1-x}N$ quantum well layer having compressive strain $\epsilon_a$, and configured to emit light having a central wavelength, $\lambda$, where 231 nm<$\lambda$<250 nm, and with a degree of polarization, $P_D$ greater than 0, wherein:
y>0.9, and $\epsilon_a$<−0.0065, if 250 nm>$\lambda$>240 nm; or
y>0.95, and $\epsilon_a$<−0.0075, if 240 nm>$\lambda$>231 nm.

18. The method of claim 17, wherein:

growing the light emitting region comprises growing the light emitting region so that a variation in reciprocal lattice values of the bulk crystalline AlN substrate and the at least one quantum well layer is less than about 1.5%.

19. The method of claim 17, wherein:

the bulk crystalline AlN substrate has a lattice constant $a_{bulk-AlN}$; and the at least one $Al_xGa_{1-x}N$ quantum well layer has a lattice constant, $a_{strained}$, where $a_{strained} - a_{bulk-AlN} \leq (\lambda\ (nm) - 230)*0.0012$ Å.

20. The method of claim 19, further comprising:

homoepitaxially growing an AlN layer above the bulk crystalline AlN substrate so that the homoepitaxially grown AlN layer is disposed between the light emitting region and the bulk crystalline AlN substrate; and removing at least some of the bulk crystalline Al substrate.

21. The method of claim 20, further comprising removing at least some of the homoepitaxially grown AlN layer.

22. The method of claim 19, further comprising:

epitaxially growing an AlGaN or AlGaInN layer above the bulk crystalline AlN substrate so that the epitaxially grown AlGaN or AlGaInN layer is disposed between the light emitting region and the bulk crystalline AlN substrate; and removing some or all of the bulk crystalline AlN substrate.

23. The method of claim 22, further comprising removing at least some of the epitaxially grown AlGaN or AlGaInN layer.

* * * * *